(12) United States Patent
Doi

(10) Patent No.: US 7,190,174 B2
(45) Date of Patent: Mar. 13, 2007

(54) METHOD FOR CALIBRATING TIMING CLOCK

(75) Inventor: Masaru Doi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/481,868

(22) Filed: Jul. 6, 2006

(65) Prior Publication Data
US 2006/0284621 A1 Dec. 21, 2006

Related U.S. Application Data

(63) Continuation of application No. PCT/JP04/18700, filed on Dec. 15, 2004.

(30) Foreign Application Priority Data

Jan. 9, 2004 (JP) .............................. 2004-004733

(51) Int. Cl.
G01R 35/00 (2006.01)
G01R 23/175 (2006.01)
(52) U.S. Cl. .................................... 324/601; 324/76.54
(58) Field of Classification Search ................. 324/601
See application file for complete search history.

(56) References Cited

U.S. PATENT DOCUMENTS 6,298,465 B1 * 10/2001 Klotchkov .................. 714/814

2002/0008503 A1 * 1/2002 Bucksh et al. ........... 324/76.54

FOREIGN PATENT DOCUMENTS

JP 2001-13217 1/2001
JP 2001-108725 4/2001

OTHER PUBLICATIONS

International Search Report issued in International application No. PCT/JP2004/018700 mailed on Apr. 19, 2005 and English translation thereof, 2 pages.

* cited by examiner

Primary Examiner—Vincent Q. Nguyen
(74) Attorney, Agent, or Firm—Osha•Liang LLP

(57) ABSTRACT

A method for calibrating a timing clock is provided. The method includes the steps of calibrating a shift amount of an edge of a shift clock by using a period of the timing clock as a reference by detecting an edge of the timing clock more than once while changing the shift amount of the edge of the shift clock; shifting and generating the edge of the shift clock by a predetermined shift amount by the calibrated shift clock generating section; and calibrating a required delay amount for delaying the timing clock by time corresponding to the predetermined shift amount by detecting the edge of the shift clock shifted by the predetermined amount while changing a delay amount of the timing clock.

7 Claims, 8 Drawing Sheets

METHOD FOR CALIBRATING TIMING CLOCK

CROSS REFERENCE TO RELATED APPLICATION

The present application claims priority from a Japanese Patent Application No. 2004-004733 filed on Jan. 9, 2004, the contents of which are incorporated herein by reference.

BACKGROUND OF THE INVENTION

1. Field of the Invention

The present invention relates to a method for calibrating a timing clock. More particularly, the present invention relates to a timing clock calibration method for calibrating a timing clock generating section that generates a timing clock indicative of a timing at which a test signal is to be fed to a device under test.

2. Related Art

A test apparatus for testing a semiconductor device includes a timing clock generating section that generates a timing clock for causing generation of a given waveform, that is a fundamental function of the test apparatus, a shift clock generating section that generates a shift clock for linearizing the timing clock, and a timing clock and shift clock phase comparing section that compares a phase of the timing clock and that of the shift clock with each other.

The timing clock generating section includes a variable timing delaying section formed by a variable delaying circuit, and a linearizing memory that stores a setting value for selecting a delay path in the variable delay circuit, and can generate a given timing clock by switching the delay path in real time. The shift clock generating section includes a phase synchronization circuit and can generate a shift clock having a given phase. Based on the assumption that the shift clock has a highly accurate phase linearity, the phase of the timing clock is matched to the phase of the shift clock while the timing clock and shift clock phase comparing section compares the timing clock and the shift clock with each other. In this manner, the phase of the timing clock is linearized and the setting value to be stored in the linearizing memory is set.

The description of a document referring to conventional art is omitted here because the inventor does not find such a document at this point in time.

With recent increase of an operation speed of a semiconductor device, generation of the timing clock with a high degree of accuracy has been required in a test apparatus. However, a conventional test apparatus has a problem that it cannot linearize the phase of the timing clock with a high degree of accuracy in a case where the shift clock contains a small phase linear error because linearization of the phase of the timing clock is performed by using the shift clock as a reference based on assumption that the shift clock generated by the shift clock generating section has highly accurate phase linearity.

SUMMARY OF THE INVENTION

Therefore, it is an object of the present invention to provide a method for calibrating a timing clock, which is capable of overcoming the above drawbacks accompanying the conventional art. The above object can be achieved by combinations described in the independent claims. The dependent claims define further advantageous and exemplary combinations of the present invention.

According to a first aspect of the present invention, a timing clock calibration method for use in a test apparatus including: a timing clock generating section for generating a timing clock indicative of a timing at which a test signal is to be fed to a device under test; a shift clock generating section for generating a shift clock used for calibrating the timing clock generating section by using a phase synchronization circuit; and a timing clock and shift clock phase comparing section for comparing a phase of the shift clock generated by the shift clock generating section and a phase of the timing clock generated by the timing clock generating section, for calibrating the timing clock generating section is provided. The timing clock calibration method includes: a shift clock calibration step for, while changing a shift amount of an edge of the shift clock, detecting an edge of the timing clock more than once by using the shift clock, to calibrate the shift amount of the edge of the shift clock by the shift clock generating section by using a period of the timing clock as a reference; a shift clock shifting step in which the shift clock generating section calibrated in the shift clock calibration step shifts and generates the edge of the shift clock by a predetermined shift amount; and a timing clock calibration step for, while changing a delay amount of the timing clock, detecting the edge of the shift clock shifted by the predetermined shift amount in the shift clock shifting step by using the timing clock to calibrate a required delay amount for delaying the timing clock by time corresponding to the predetermined shift amount.

The shift clock generating section may include: a reference clock and shift clock phase comparing section for comparing a high-level or low-level duration of a reference signal corresponding to a reference clock and that of a shift signal corresponding to the shift clock; a voltage-controlled oscillating section for changing the shift amount of the edge of the shift clock in accordance with a result of comparison in the reference clock and shift clock phase comparing section; and a pulse control section for changing the shift amount of the edge of the shift clock by adding an insertion pulse to the shift signal input to the reference clock and shift clock phase comparing section. The shift clock calibration step may include: a timing clock edge detection step for detecting an edge of the timing clock more than once, while sequentially changing a number of insertion pulses to be added to the shift signal input to the reference clock and shift clock phase comparing section per unit time to change the shift amount of the edge of the shift clock; a number of insertion pulses measurement step for measuring the number of the insertion pulses to be added to the shift signal for changing the shift amount of the edge of the shift clock by a predetermined number of periods of the timing clock based on a detection result in the timing clock edge detection step; and a shift amount calculation step for calibrating the shift amount of the edge of the shift clock by calculating a shift amount of the edge of the shift clock obtained by one insertion pulse added to the shift signal based on the number of the insertion pulses measured in the number of insertion pulses measurement step and time equal to the predetermined number of periods of the timing clock.

The timing clock generating section may include: a variable timing delaying section including a plurality of variable delaying circuits for sequentially delaying the reference clock; and a linearizing memory that stores a setting value of the variable timing delaying section for obtaining a delay time the reference clock to corresponding to a delay time of the reference clock. The timing clock calibration step may include: a shift clock edge detection step for detecting the edge of the shift clock that is shifted by the predetermined shift amount, while sequentially changing the setting value of the variable timing delaying section to change the delay amount of the timing clock; and a delay amount calibration step for calibrating the delay amount of the timing clock by making the linearizing memory store the setting value for which the edge of the timing clock is coincident with the edge of the shift clock to correspond to the delay time that is the predetermined shift amount.

The shift clock shifting step may include shifting the edge of the shift clock by the predetermined shift amount by adding one ore more insertion pulses, the number of which is equal to or less than the number of the insertion pulses measured in the number of insertion pulses measurement step, to the shift signal.

The timing clock generating section may include a plurality of variable timing delaying sections for delaying a reference clock to generate a plurality of timing clocks, respectively, and a plurality of variable skew delaying sections for delaying the plurality of timing clocks to adjust skews of the plurality of timing clocks generated by the plurality of variable timing delaying sections, respectively. The timing clock and shift clock phase comparing section may include a plurality of timing comparing sections for comparing the phase of the shift clock generated by the shift clock generating section with phases of the timing clocks generated by the plurality of variable timing delaying sections, respectively. The timing clock calibration method may further include a delay amount adjustment step for adjusting delay amounts in the plurality of variable skew delaying sections to make the phases of the plurality of timing clocks generated by the variable timing delaying sections approximately equal to each other in the plurality of timing comparing sections, respectively. The shift clock calibration step may include calibration of the shift amount of the edge of the shift clock by using a period of one of the plurality of timing clocks as a reference, and the timing clock calibration step may include calibration of delay amounts required for delaying the plurality of timing clocks by the predetermined shift amount by using the phases of the plurality of timing clocks adjusted in the delay amount adjustment step as a reference, respectively.

The timing clock generating section may include a variable timing delaying section for delaying a reference clock to generate the timing clock, and a variable skew delaying section for delaying the timing clock to adjust a skew of the timing clock generated by the variable timing delaying section. The timing clock and shift clock phase comparing section may include a timing comparing section for comparing the phase of the shift clock generated by the shift clock generating section and the phase of the timing clock generated by the variable timing delaying section. The timing clock calibration method may further include a delay amount adjustment step for adjusting a delay amount in the variable skew delaying section to adjust the phase of the timing clock generated by the variable timing clock delaying section in the timing comparing section, the shift clock calibration step may include calibration of the shift amount of the edge of the shift clock by using a period of the timing clock as a reference, and the timing clock calibration step may include calibration of a delay amount required for delaying the timing clock by time corresponding to the predetermined shift amount by using the phase of the timing clock adjusted in the delay amount adjustment step as a reference.

According to a second aspect of the present invention, a timing clock calibration method for use in a test apparatus including: a plurality of variable timing delaying sections for generating a plurality of timing clocks each indicating a timing at which a test signal is to be fed to a device under test; a plurality of variable skew delaying sections for delaying the plurality of timing clocks to adjust skews of the plurality of timing clocks generated by the plurality of variable timing delaying sections, respectively; a shift clock generating section for generating a shift clock used for calibration of the plurality of variable timing delaying sections by using a phase synchronization circuit; and a plurality of timing comparing sections for comparing a phase of the shift clock generated by the shift clock generating section with phases of the plurality of timing clocks generated by the plurality of variable timing delaying sections, respectively, for calibrating the plurality of variable timing delaying sections is provided. The timing clock calibration method includes: a delay amount adjustment step for adjusting delay amounts in the plurality of variable skew delaying sections to make the phases of the plurality of timing clocks generated by the plurality of variable timing delaying sections approximately equal to each other in the plurality of timing comparing sections, respectively; a shift clock shifting step in which the shift clock generating section shifts and generates an edge of the shift clock by a predetermined shift amount; and a timing clock calibration step for, while changing the delay amounts of the plurality of timing clocks, detecting the edge of the shift clock shifted by the predetermined shift amount in the shift clock shifting step by using the respective timing clocks, to calibrate required delay amounts for delaying the plurality of timing clocks by time corresponding to the predetermined shift amount by using the phases of the plurality of timing clocks adjusted in the delay amount adjustment step as a reference.

The summary of the invention does not necessarily describe all necessary features of the present invention. The present invention may also be a sub-combination of the features described above.

According to the present invention, a timing clock calibration method is capable of linearizing a timing clock in a short time with a high degree of accuracy.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
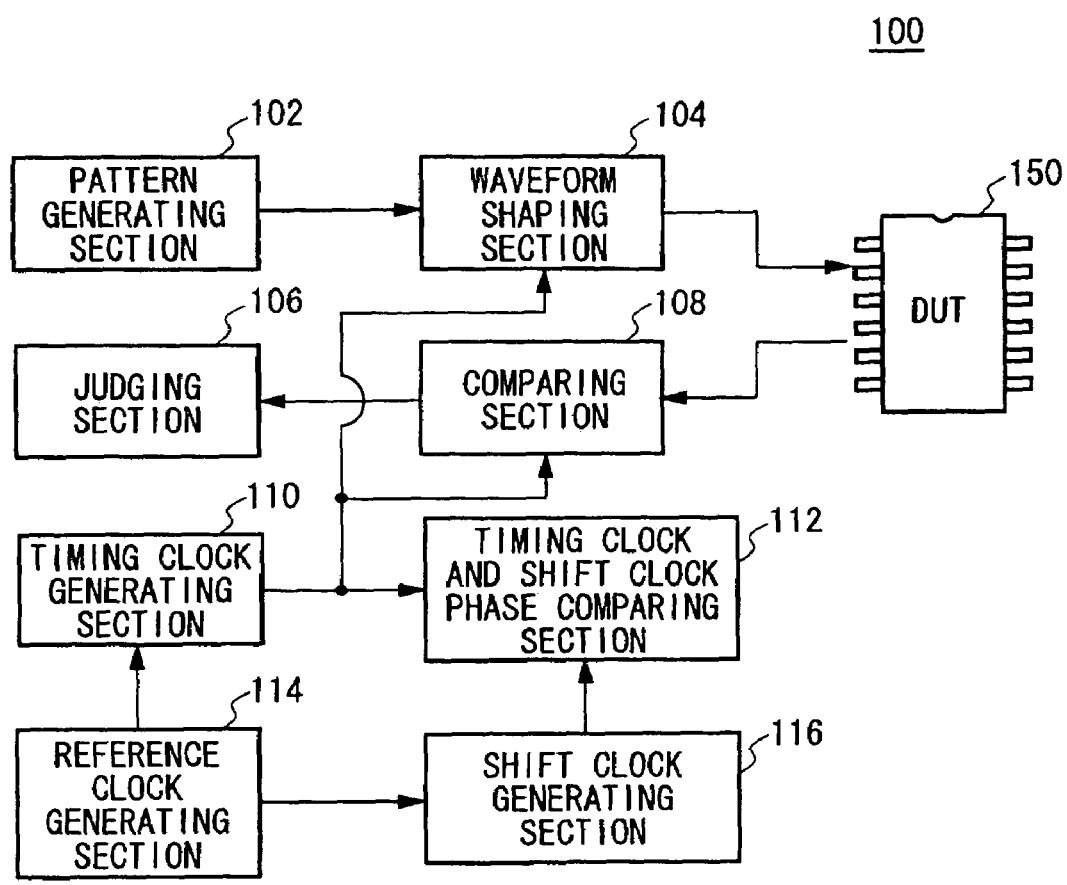
FIG. 1 shows an exemplary structure of a test apparatus 100.

FIG. 1 shows an exemplary structure of a test apparatus 100 according to an embodiment of the present invention. The test apparatus 100 includes a pattern generating section 102, a waveform shaping section 104, a judging section 106, a comparing section 108, a timing clock generating section 110, a timing clock and shift clock phase comparing section 112, a reference clock generating section 114, and a shift clock generating section 116.

The reference clock generating section 114 generates a reference clock that is used as a reference in a test of a device under test 150 by the test apparatus 100. The timing clock generating section 110 delays the reference clock to generate a timing clock indicative of a timing at which a test signal which is generated by the pattern generating section 102 so as to cause generation of a given waveform as a fundamental function of the test apparatus 100 is to be fed to the device under test 150. The shift clock generating section 116 generates a shift clock used for calibration of the timing clock generating section 110 by using a phase synchronization circuit such as a PLL (Phase Locked Loop) circuit. The timing clock and shift clock phase comparing section 112 compares a phase of the shift clock generated by the shift clock generating section 116 and a phase of the timing clock generated by the timing clock generating section 110 with each other and calibrates the phase of the timing clock by using the shift clock.

The pattern generating section 102 generates a test signal for testing the device under test 150. The waveform shaping section 104 shapes a waveform of the test signal generated by the pattern generating section 102 and feeds the test signal to the device under test 150 based on the timing clock generated by the timing clock generating section 110. The comparing section 108 compares an output signal that the device under test 150 outputs in response to the test signal with an expected value of the output signal to be output from the device under test 150 in response to that test signal based on the timing clock generated by the timing clock generating section 110 and outputs a comparison result. The judging section 106 judges acceptability of the device under test 150 based on the comparison result output from the comparing section 108.

According to the test apparatus 100 of the present embodiment, it is possible to accurately calibrate the phase of the timing clock by calibrating the shift amount of the shift clock based on the timing clock prior to calibration of the phase of the timing clock based on the shift clock. Therefore, the device under test 150 can be accurately tested and its acceptability can be judged appropriately.

Figure 2:
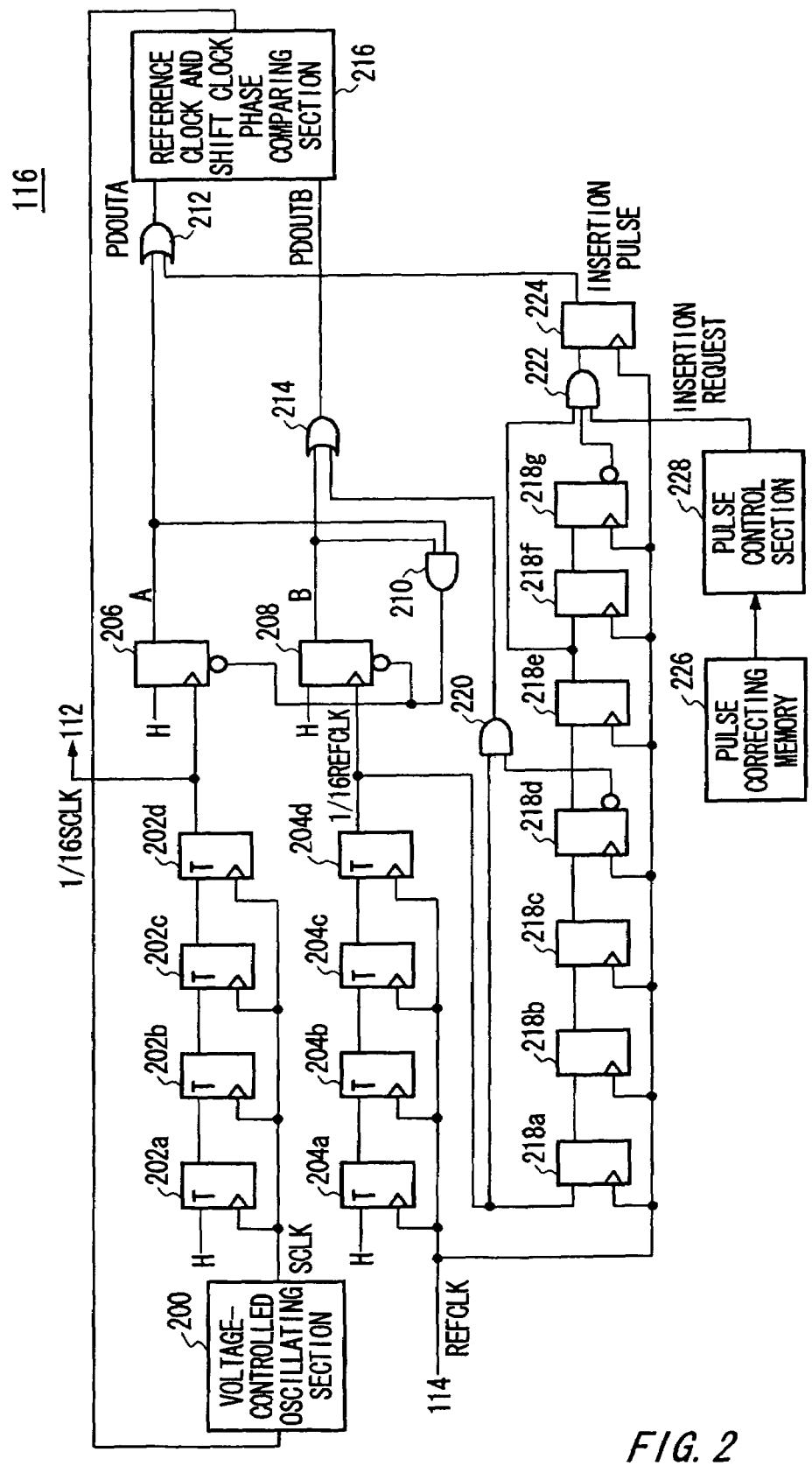
FIG. 2 shows an exemplary structure of a shift clock generating section 116.

FIG. 2 shows an exemplary structure of the shift clock generating section 116 of the present embodiment. The shift clock generating section 116 includes a voltage-controlled oscillating section 200, a plurality of T flip-flop circuits 202a to 202d, a plurality of T flip-flop circuits 204a to 204d, a flip-flop circuit 206, a flip-flop circuit 208, an AND circuit 210, an OR circuit 212, an OR circuit 214, a reference clock and shift clock phase comparing section 216, a plurality of flip-flop circuits 218a to 218g, an AND circuit 220, an AND circuit 222, and a flip-flop circuit 224. SCLK and ¹⁄₁₆SCLK in the present embodiment are examples of the shift clock in the present invention and REFCLK and ¹⁄₁₆REFCLK are examples of the reference clock in the present invention. PDOUTA in the present embodiment is an exemplary shift signal in the present invention and PDOUTB is an exemplary reference signal in the present invention.

The reference clock and shift clock phase comparing section 216 compares a high-level duration or a low-level duration of PDOUTA corresponding to ¹⁄₁₆SCLK with that of PDOUTB corresponding to ¹⁄₁₆REFCLK and outputs a control signal in accordance with the comparison result so as to make a pulse area in PDOUTA equal to that in PDOUTB. The voltage-controlled oscillating section 200 receives the control signal output from the reference clock and shift clock phase comparing section 216 and changes a shift amount of an edge of SCLK in accordance with the comparison result in the reference clock and shift clock phase comparing section 216. A pulse control section 228 changes the shift amount of the edge of SCLK by adding an insertion pulse to PDOUTA input to the reference clock and shift clock phase comparing section 216. A pulse correcting memory 226 stores the number of insertion pulses to be added to PDOUTA per unit time in such a manner that that number corresponds to the shift amount of SCLK. For example, the pulse correcting memory 226 stores how often the insertion pulse should be inserted.

Figure 3:
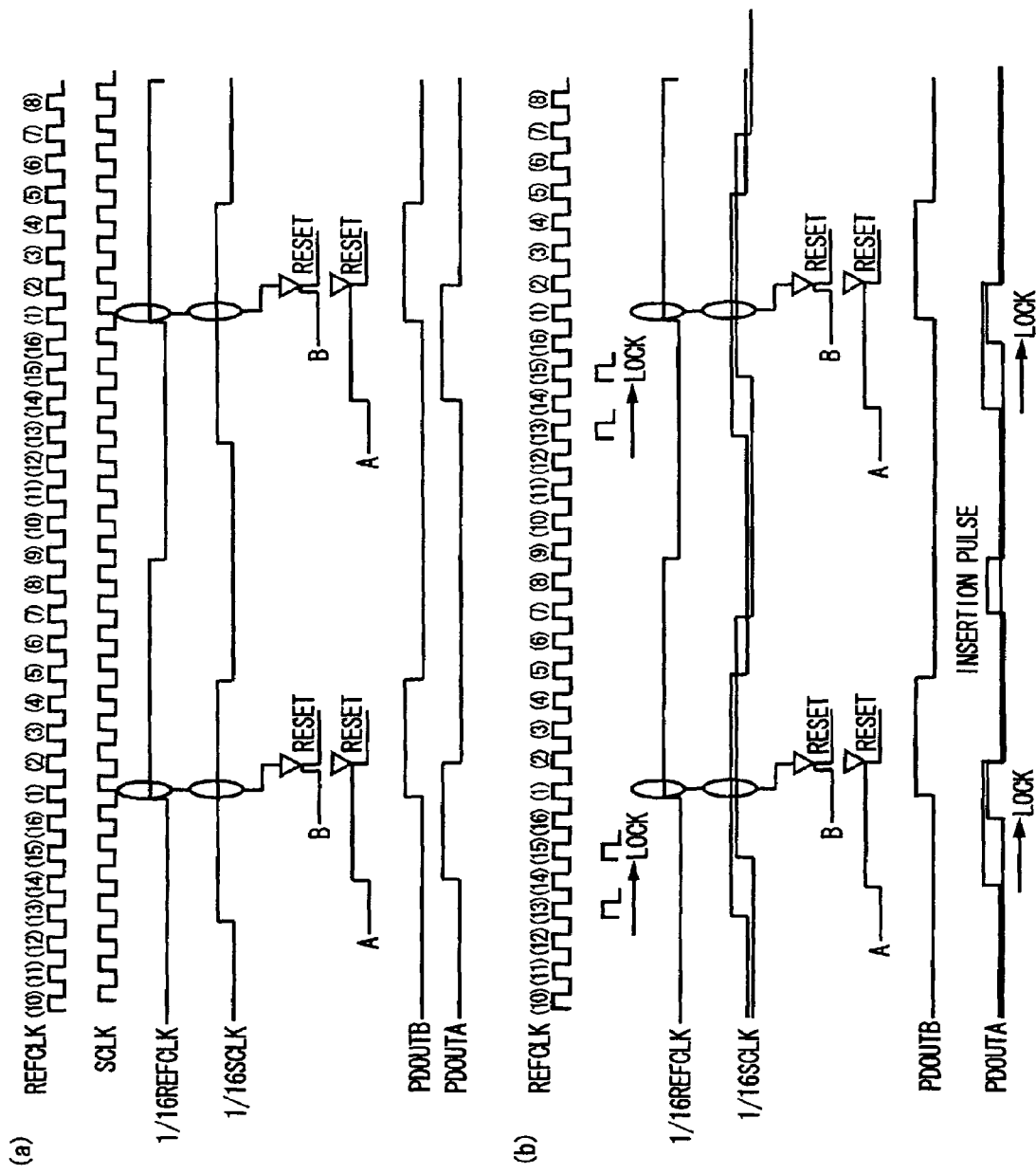
FIG. 3 is a timing chart of the shift clock generating section 116.

FIG. 3 is a timing chart of the shift clock generating section 116 of the present embodiment. FIG. 3(a) is a timing chart in a case where PDOUTA is locked with no insertion pulse added thereto. FIG. 3(b) is a timing chart in a case where PDOUTA is locked with the insertion pulse added thereto.

Referring to FIGS. 2, 3(a) and 3(b), an operation of the shift clock generating section 116 is described. The voltage-controlled oscillating section 200 controls the shift amount based on the control signal output from the reference clock and shift clock phase comparing section 216 and outputs SCLK. The T flip-flop circuits 202a to 202d are connected in series and sequentially latch and output an H-level signal based on SCLK output from the voltage-controlled oscillating section 200. That is, the T flip-flop circuits 202a to 202d output ¹⁄₁₆SCLK obtained by dividing SCLK output from the voltage-controlled oscillating section 200. The T flip-flop circuits 204a to 204d are connected in series and sequentially latch and output an H-level signal based on REFCLK generated by the reference clock generating section 114. That is, the T flip-flop circuits 204a to 204d output ¹⁄₁₆REFCLK obtained by dividing REFCLK generated by the reference clock generating section 114.

The flip-flop circuit 206 latches an H-level signal to provide an output A by using an inverted signal of a result of a logical AND operation of the output A of the flip-flop circuit 206 and an output B of the flip-flop circuit 208 by the AND circuit 210 as an enable signal based on ¹⁄₁₆SCLK output from the T flip-flop circuit 202d. The flip-flop circuit 208 latches an H-level signal and provides the output B by using an inverted signal of a result of a logical AND operation of the output A of the flip-flop circuit 206 and the output B of the flip-flop circuit 208 by the AND circuit 210 as an enable signal based on ¹⁄₁₆REFCLK output from the T flip-flop circuit 204d. That is, the output A of the flip-flop circuit 206 and the output B of the flip-flop circuit 208 are reset when both of them are logical H.

The flip-flop circuits 218a to 218g are connected in series and sequentially latch and output ¹⁄₁₆REFCLK output from the T flip-flop circuit 204d based on REFCLK generated by the reference clock generating section 114. That is, each of the flip-flop circuits 218a to 218g delays a phase of ¹⁄₁₆REF-CLK by one period of REFCLK. The AND circuit 220 outputs a result of a logical AND operation of ¹⁄₁₆REFCLK output from the T flip-flop circuit 204d and an inverted signal of a signal which is output from the flip-flop circuit 218d and in which the phase of ¹⁄₁₆REFCLK is delayed by four periods of REFCLK. The AND circuit 222 outputs a result of a logical AND operation of a signal which is output from the flip-flop circuit 218e and in which the phase of $\frac{1}{16}$REFCLK is delayed by five periods of REFCLK, an inverted signal of a signal which is output from the flip-flop circuit 218g and in which the phase of $\frac{1}{16}$REFCLK is delayed by seven periods of REFCLK, and an insertion request output from the pulse control section 228. The flip-flop circuit 224 latches and outputs an output of the AND circuit 222 based on REFCLK generated by the reference clock generating section 114.

In other words, in a case where PDOUTA is locked with no insertion pulse added thereto, the pulse control section 228 does not set the insertion request and the AND circuit 222 outputs an L-level signal as the result of the logical AND operation. Thus, the flip-flop circuit 224 outputs an L-level signal and no insertion pulse is output. On the other hand, in a case where PDOUTA is locked with the insertion pulse added thereto, the pulse control section 228 sets the insertion request and the AND circuit 222 outputs an H-level signal as the result of the logical AND operation. Thus, the flip-flop circuit 224 outputs an H-level signal and the insertion pulse is output.

The OR circuit 212 performs a logical OR operation of the output A of the flip-flop circuit 206 and the insertion pulse that is the output of the flip-flop circuit 224, and feeds PDOUTA that is the operation result to the reference clock and shift clock phase comparing section 216. In a case where PDOUTA is locked with no insertion pulse added thereto, the OR circuit 212 feeds the output A of the flip-flop circuit 206 to the reference clock and shift clock phase comparing section 216 as PDOUTA that is the operation result of the OR circuit 212. On the other hand, in a case where PDOUTA is locked with the insertion pulse added thereto, the OR circuit 212 feeds the output A of the flip-flop circuit 206 with the insertion pulse that is output from the flip-flop circuit 224 and is added to the output A to the reference clock and shift clock phase comparing section 216 as PDOUTA. The OR circuit 214 performs a logical OR operation of the output B of the flip-flop circuit 208 and the output of the AND circuit 220 and feeds PDOUTB that is the operation result to the reference clock and shift clock phase comparing section 216.

As described above, the pulse control section 228 outputs the insertion request and the insertion pulse output from the flip-flop circuit 224 is added to PDOUTA, thus changing the pulse areas in PDOUTA and PDOUTB. The reference clock and shift clock phase comparing section 216 controls the voltage-controlled section 200 so as to make the pulse areas in PDOUTA and PDOUTB equal to each other. In this manner, it is possible to control the shift amount of SCLK and also control the shift amount of $\frac{1}{16}$SCLK fed to the timing clock and shift clock phase comparing section 112.

Assuming that a frequency of REFCLK is 250 MHz, for example, $\frac{1}{16}$SCLK can be shifted by 0.98 ps by inserting the insertion pulse once to PDOUTA every 8192 cycles of SCLK. When the insertion pulse is added to PDOUTA in every cycle of SCLK, $\frac{1}{16}$SCLK can be shifted by 8 ns that is equal to a pulse width of the insertion pulse.

Figure 4:
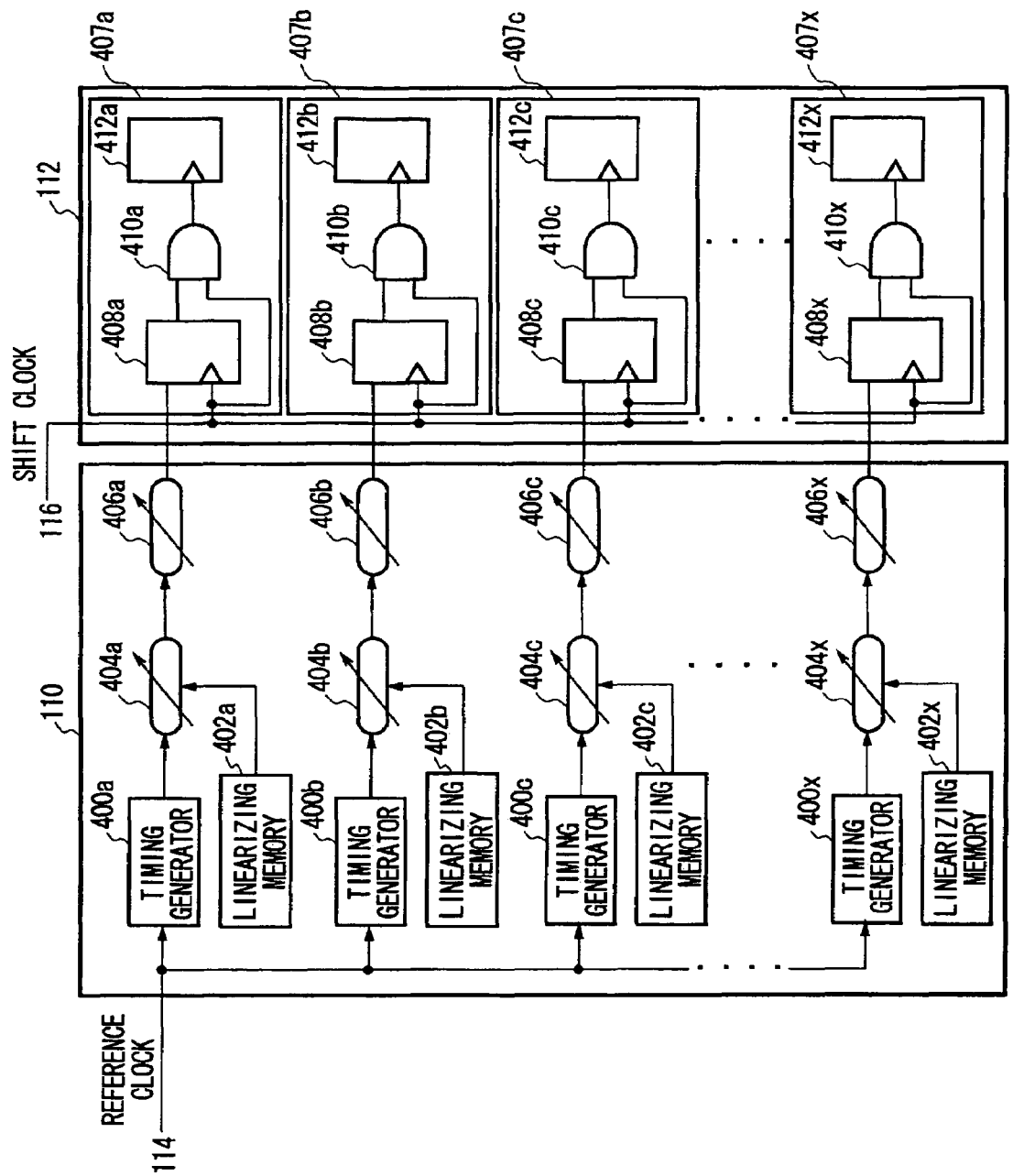
FIG. 4 shows an exemplary structure of a timing clock generating section 110 and a timing clock and shift clock phase comparing section 112.

FIG. 4 shows an exemplary structure of the timing clock generating section 110 and that of the timing clock and shift clock phase comparing section 112 of the present embodiment. The timing clock generating section 110 includes a plurality of timing generating sections 400a to 400x, a plurality of linearizing memories 402a to 402x, a plurality of variable timing delaying sections 404a to 404x, and a plurality of variable skew delaying sections 406a to 406x. The timing clock and shift clock phase comparing section 112 includes a plurality of timing comparing sections 407a to 407x. Each of the timing comparing sections 407a to 407x includes an associated one of flip-flop circuits 408a to 408x, an associated one of AND circuits 410a to 410x, and an associated one of counters 412a to 412x.

Each of the timing generating sections 400a to 400x is a circuit for extracting a pulse at a given position from the reference clock (REFCLK) generated by the reference clock generating section 114 and has delaying resolution equal to or larger than the period of the reference clock. The variable timing delaying sections 404a to 404x include a plurality of variable delaying circuits for sequentially delaying parts of the reference clock extracted by the corresponding timing generating sections 400a to 400x, thereby generating a plurality of timing clocks, respectively. The linearizing memories 402a to 402x store setting values for setting delaying paths in the variable timing delaying sections 404a to 404x for obtaining delay times of the reference clock so as to corresponding to the delay times. The timing clock for causing generation of a given waveform that is a fundamental function of the test apparatus 100 is generated by switching the delaying paths in the variable timing delaying sections 404a to 404x in real time based on the setting values stored in the linearizing memories 402a to 402x. The variable skew delaying sections 406a to 406x delay the timing clocks generated by the variable timing delaying sections 404a to 404x so as to adjust skews of those timing clocks, respectively.

The timing comparing sections 407a to 407x compare the phase of the shift clock ($\frac{1}{16}$SCLK) generated by the shift clock generating section 116 with phases of the timing clocks that are generated by the corresponding variable timing delaying sections 404a to 404x and are delayed by the corresponding variable skew delaying circuits 406a to 406x, respectively. More specifically, the flip-flop circuits 408a to 408x latch and output the timing clocks output from the corresponding variable skew delaying sections 406a to 406x based on the shift clock generated by the shift clock generating section 116. The AND circuits 410a to 410x output results of logical AND operations of outputs of the corresponding flip-flop circuits 408a to 408x and the shift clock generated by the shift clock generating section 116, respectively. The counters 412a to 412x count the number of outputs of H-level signal from corresponding the AND circuits 410a to 410x, respectively. In a case where the phase of the shift clock and the phase of the timing clock are compared with each other more than once while the shift amount of an edge of the shift clock and the delay amount of the timing clock are fixed, for example, it is judged that the phases of the shift clock and the timing clock are coincident with each other when counts by the counters 412a to 412x are approximately half of the number of comparisons between the shift clock and timing clock.

Figure 5:
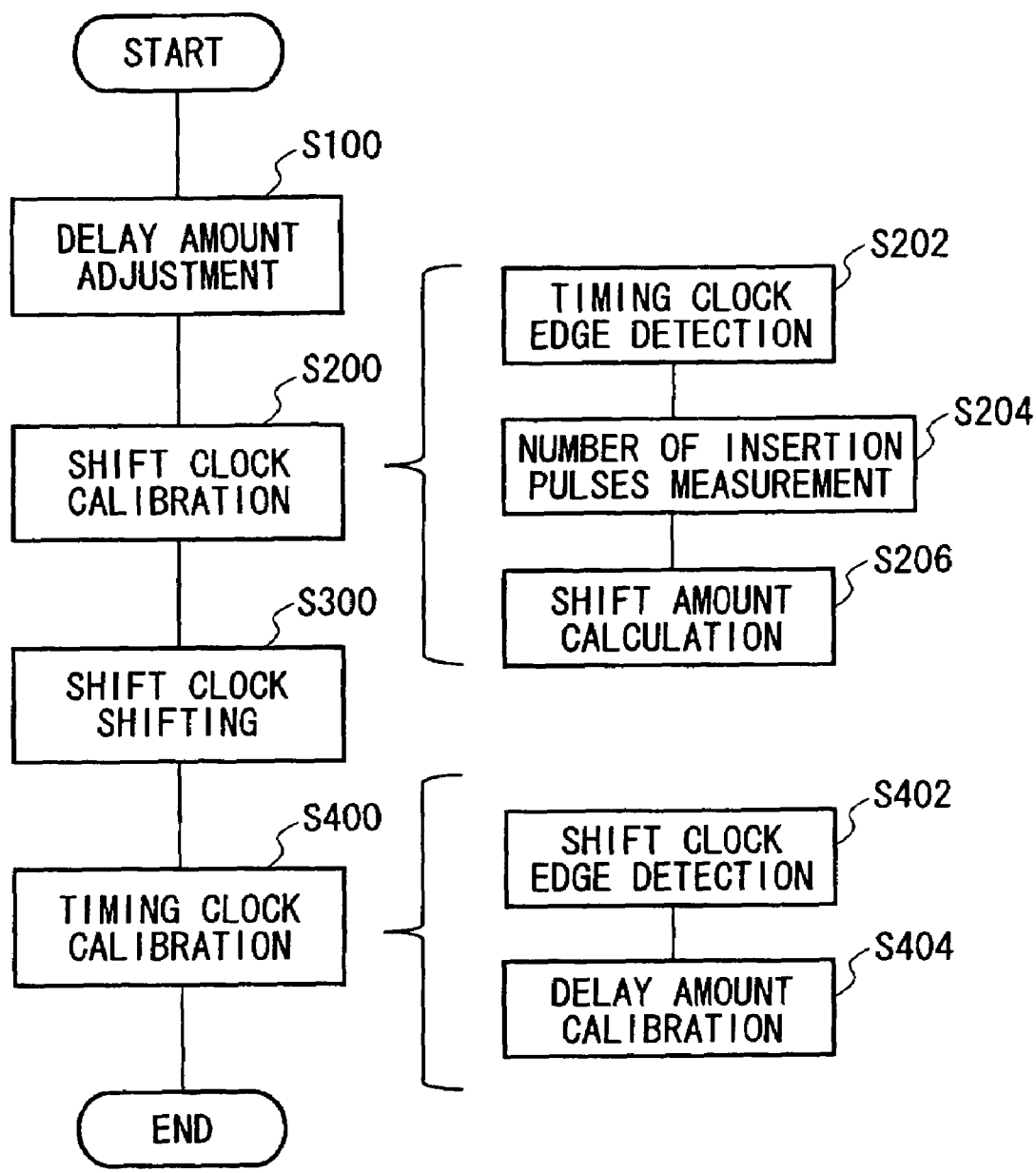
FIG. 5 shows an exemplary flow of a timing clock calibration method.
Figure 6:
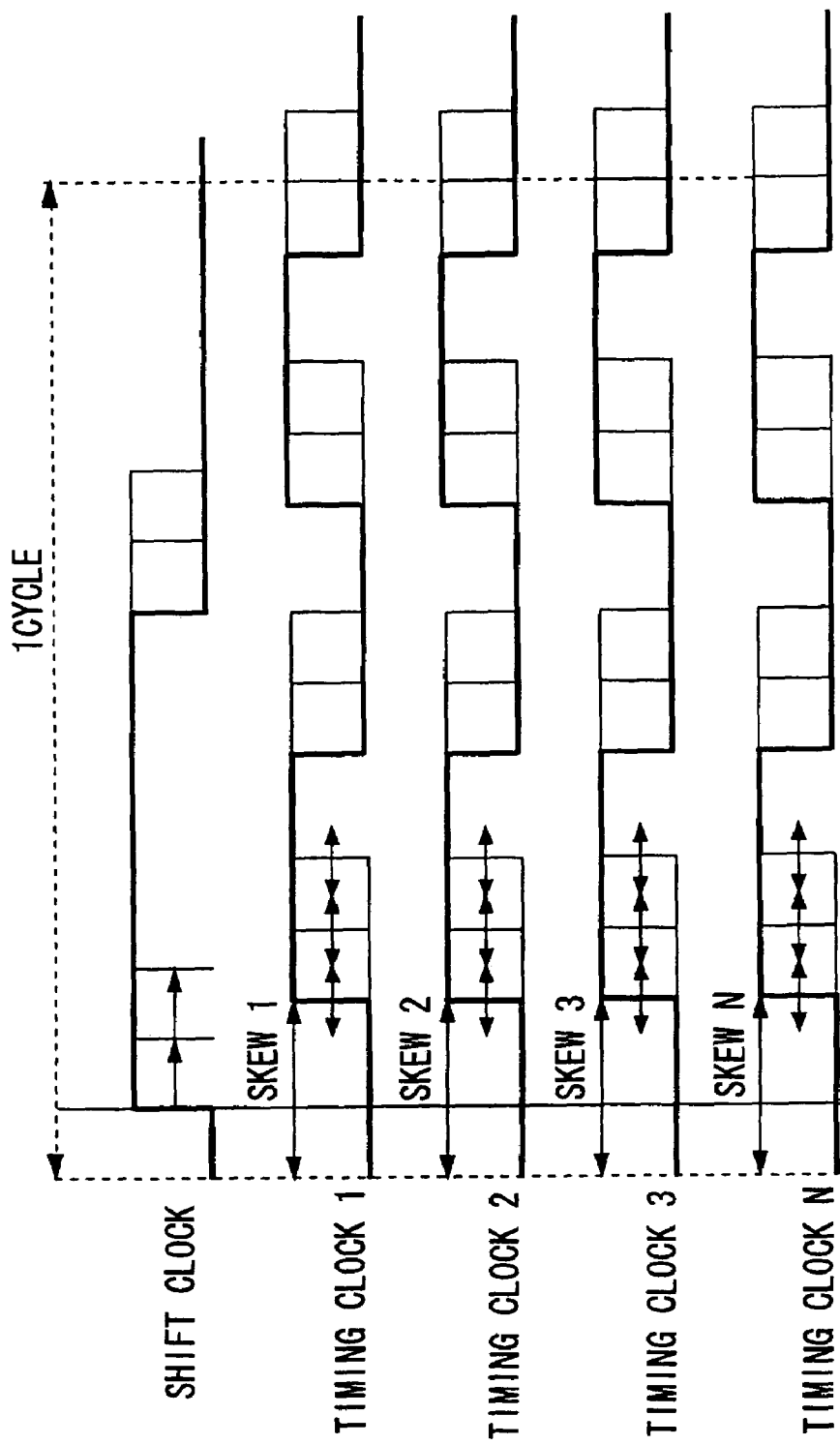
FIG. 6 explains a delay amount adjustment step (Step S100).
Figure 7:
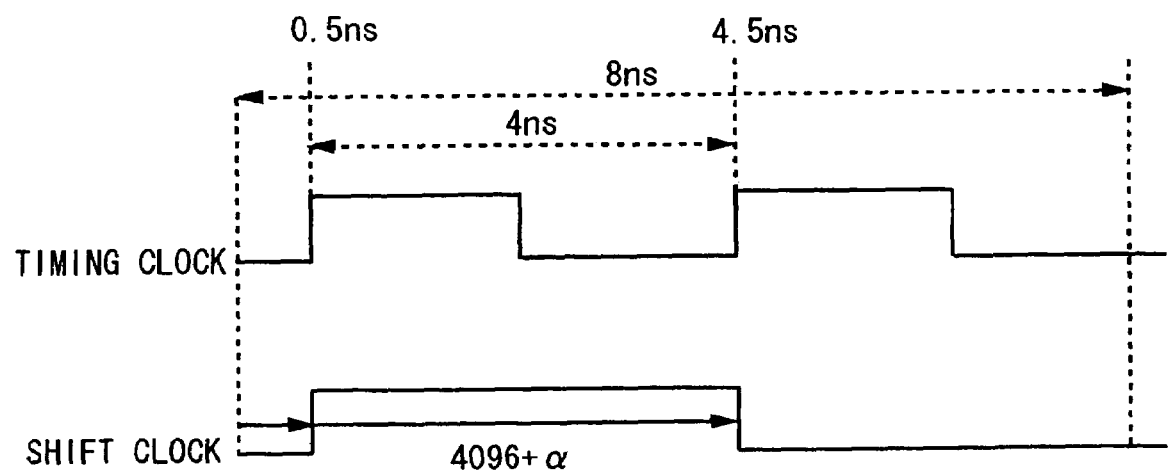
FIG. 7 explains a number of insertion pulses measurement step (Step S204).

FIG. 5 shows an exemplary flow of a timing clock calibration method of the present embodiment. FIGS. 6 and 7 explain a delay amount adjustment step (Step S100) and a number of insertion pulses measurement step (Step S204) in the present embodiment, respectively.

In the delay amount adjustment step (Step S100), delay amounts in a plurality of variable skew delaying sections 406a to 406x are adjusted so as to make the phases of the timing clocks generated by the variable timing delaying sections 404a to 404x approximately equal to each other in the timing comparing sections 407a to 407x, respectively. More specifically, the phases of the timing clocks generated by the timing clock generating section 110 are detected by the timing clock and shift clock phase comparing section 112 based on the shift clock generated by the shift clock generating section 116, and one of the timing clocks that has the latest phase is detected. Then, the shift amount of the shift clock is changed to make the phase of the shift clock coincident with the phase of the detected timing clock. The delay amounts in the variable skew delaying sections 406a to 406x are then adjusted to make the phases of the timing clocks other than the detected timing clock coincident with the phase of the shift clock, as shown in FIG. 6.

In a shift clock calibration step (Step S200), while the shift amount of an edge of the shift clock is changed by the shift clock generating section 116, an edge of one of the timing clocks that is selected in an arbitrary manner is detected more than once by using the shift clock. In this manner, the shift amount of the edge in the shift clock by the shift clock generating section 116 is calibrated by using a period of the timing clock as a reference. More specifically, in a timing clock edge detection step (Step S202), the edge of the timing clock is detected more than once, while the number of insertion pulses added to PDOUTA that is input to the reference clock and shift clock phase comparing section 216 per unit time is sequentially changed to change the shift amount of the edge of the shift clock. In a number of insertion pulses measurement step (Step S204), the number of insertion pulses to be added to PDOUTA in order to change the shift amount of the edge of the shift clock by a predetermined number of periods of the timing clock is measured based on the detection result in the timing clock edge detection step (Step S202). For example, in a case where the frequency of REFCLK is assumed to be 250 MHz, 4096+α is measured as the number of insertion pulses to be added to the shift signal in order to change the shift amount of the edge of the shift clock by time equal to a half of the period of the timing clock (4 ns), as shown in FIG. 7. In a shift amount calculation step (Step S206), a shift amount of the edge of the shift clock obtained by one insertion pulse added to the shift signal is calculated based on the number of insertion pulses measured in the number of insertion pulses measurement step (Step S204) and time equal to the predetermined number of periods of the timing clock, thereby calibrating the shift amount of the edge of the shift clock.

In a shift clock shifting step (Step S300), the shift clock generating section 116 calibrated in the shift clock calibration step (Step S200) adds one or more insertion pulses, the number of which is equal to or less than the number of insertion pulses measured in the number of insertion pulses measurement step (Step S204), to PDOUTA, thereby sequentially generating edges in the shift clock that are shifted by a predetermined shift amount.

In the timing clock calibration step (Step S400), while the delay amount of the timing clock is changed, the edge of the shift clock, which is shifted by the predetermined shift amount in the shift clock shifting step (Step S300), is detected by using the timing clock. In this manner, delay amounts required for delaying the timing clocks by time corresponding to the predetermined shift amount are calibrated by using the phases of the timing clocks adjusted in the delay amount adjustment step (Step S100) as references, respectively. More specifically, in a shift clock edge detection step (Step S402), while the setting values of the variable timing delaying sections 404a to 404x are sequentially changed based on the setting values stored in the linearizing memories 402a to 402x to switch delay paths and change the delay amounts of the timing clocks, respectively, the edge of the shift clock that is shifted by the predetermined shift amount is detected. In a delay amount calibration step (Step S404), the setting values for which the edges of the timing clocks are coincident with the edge of the shift clock are stored in the linearizing memories 402a to 402x to correspond to a delay time that is the predetermined shift amount, thereby calibrating the delay amounts of the timing clocks.

Figure 8:
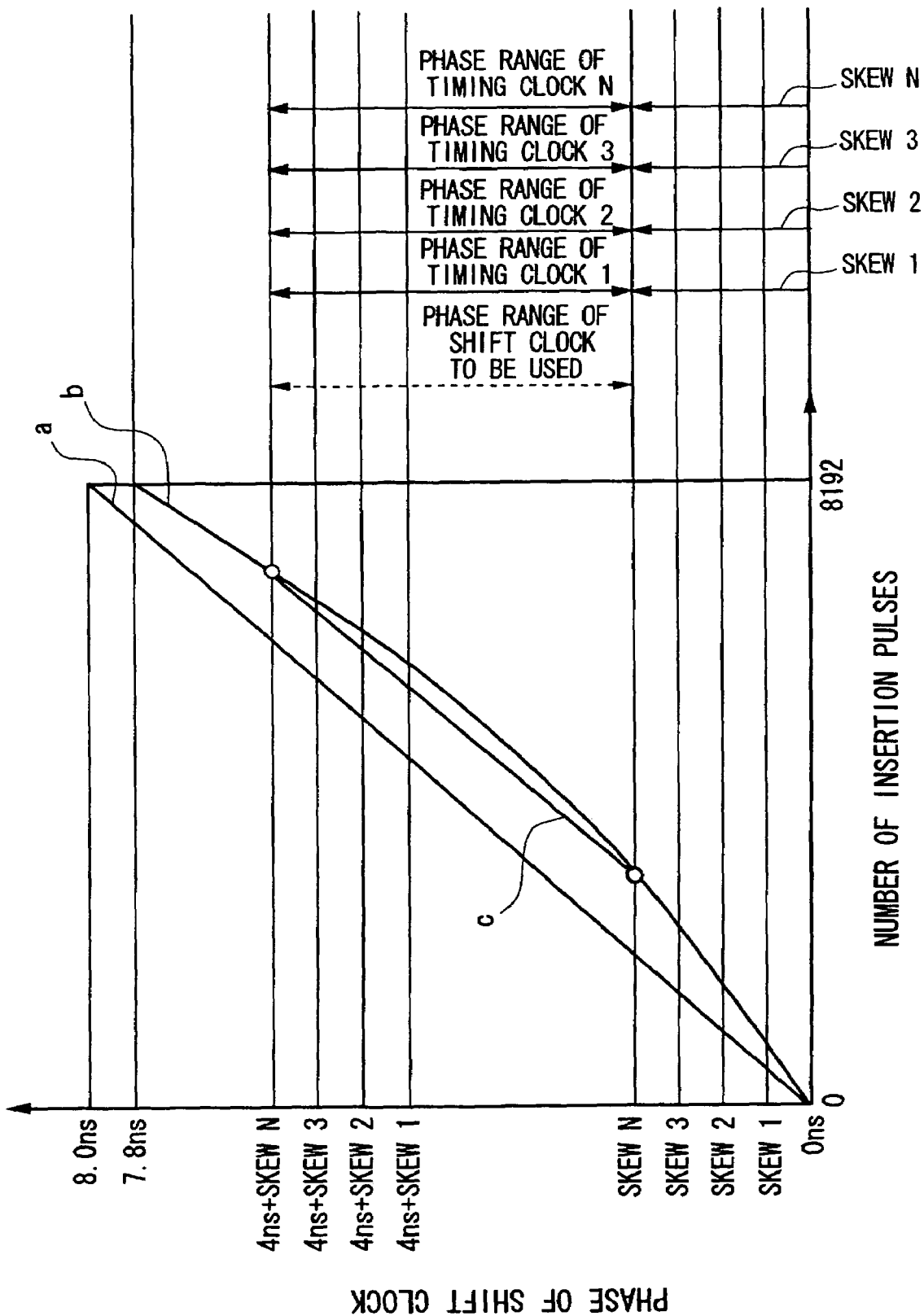
FIG. 8 shows a relationship between a phase of a shift clock and the number of insertion pulses.

FIG. 8 shows a relationship between the phase of the shift clock and the number of insertion pulses in the present embodiment. The horizontal axis represents the number of insertion pulses and the vertical axis represents the phase of the shift clock. Line a represents a relationship between an ideal phase of the shift clock and the number of insertion pulses, curve b represents a relationship between an actual phase of the shift clock and the number of insertion pulses, and line c represents a phase of the shift clock that is corrected by first order linear correction and the number of insertion pulses.

According to the test apparatus 100 of the present embodiment, skews 1 to N are made coincident with each other by using the variable skew delaying sections 406a to 406x in the delay amount adjustment step (Step S100) to make the phases of the timing clocks that are input to the timing clock and shift clock phase comparing section 112 coincident with each other. Thus, it is possible to linearize a plurality of timing clocks by using the same phase range of the shift clock. Therefore, the phase range of the shift clock to be used can be made narrower, thus suppressing a linear error to be minimum and allowing accurate linearization of the timing clock. Moreover, time required for linearizing the timing clock can be shortened.

Although the present invention has been described by way of exemplary embodiments, it should be understood that those skilled in the art might make many changes and substitutions without departing from the spirit and the scope of the present invention which is defined only by the appended claims.

What is claimed is:

1. A timing clock calibration method for use in a test apparatus including: a timing clock generating section for generating a timing clock indicative of a timing at which a test signal is to be fed to a device under test; a shift clock generating section for generating a shift clock used for calibrating the timing clock generating section by using a phase synchronization circuit; and a timing clock and shift clock phase comparing section for comparing a phase of the shift clock generated by the shift clock generating section and a phase of the timing clock generated by the timing clock generating section, for calibrating the timing clock generating section comprising:

a shift clock calibration step for, while changing a shift amount of an edge of the shift clock, detecting an edge of the timing clock more than once by using the shift clock to calibrate the shift amount of the edge of the shift clock by the shift clock generating section by using a period of the timing clock as a reference;

a shift clock shifting step in which the shift clock generating section calibrated in the shift clock calibration step shifts and generates the edge of the shift clock by a predetermined shift amount; and a timing clock calibration step for, while changing a delay amount of the timing clock, detecting the edge of the shift clock shifted by the predetermined shift amount in the shift clock shifting step by using the timing clock to calibrate a required delay amount for delaying the timing clock by time corresponding to the predetermined shift amount.

2. The timing clock calibration method of claim 1, wherein the shift clock generating section includes: a reference clock and shift clock phase comparing section for comparing a high-level or low-level duration of a reference signal corresponding to a reference clock and that of a shift signal corresponding to the shift clock; a voltage-controlled oscillating section for changing the shift amount of the edge of the shift clock in accordance with a result of comparison in the reference clock and shift clock phase comparing section; and a pulse control section for changing the shift amount of the edge of the shift clock by adding an insertion pulse to the shift signal input to the reference clock and shift clock phase comparing section, and the shift clock calibration step includes:

a timing clock edge detection step for detecting an edge of the timing clock more than once, while sequentially changing a number of insertion pulses to be added to the shift signal input to the reference clock and shift clock phase comparing section per unit time to change the shift amount of the edge of the shift clock;

a number of insertion pulses measurement step for measuring the number of the insertion pulses to be added to the shift signal for changing the shift amount of the edge of the shift clock by a predetermined number of periods of the timing clock based on a detection result in the timing clock edge detection step; and a shift amount calculation step for calibrating the shift amount of the edge of the shift clock by calculating a shift amount of the edge of the shift clock obtained by one insertion pulse added to the shift signal based on the number of the insertion pulses measured in the number of insertion pulses measurement step and time equal to the predetermined number of periods of the timing clock.

3. The timing clock calibration method of claim 2, wherein the timing clock generating section includes: a variable timing delaying section including a plurality of variable delaying circuits for sequentially delaying the reference clock; and a linearizing memory for storing a setting value of the variable timing delaying section for obtaining a delay time of the reference clock to correspond to the delay time of the reference clock, and the timing clock calibration step includes:

a shift clock edge detection step for detecting the edge of the shift clock that is shifted by the predetermined shift amount, while sequentially changing the setting value of the variable timing delaying section to change a delay amount of the timing clock; and a delay amount calibration step for calibrating the delay amount of the timing clock by making the linearizing memory store the setting value for which the edge of the timing clock is coincident with the edge of the shift clock to correspond to the delay time that is the predetermined shift amount.

4. The timing clock calibration method of claim 2, wherein the shift clock shifting step includes shifting the edge of the shift clock by the predetermined shift amount by adding one or more insertion pulses, the number of which is equal to or less than the number of the insertion pulses measured in the number of insertion pulses measurement step, to the shift signal.

5. The timing clock calibration method of claim 1, wherein the timing clock generating section includes a plurality of variable timing delaying sections for delaying a reference clock to generate a plurality of timing clocks, respectively, and a plurality of variable skew delaying sections for delaying the plurality of timing clocks to adjust skews of the plurality of timing clocks generated by the plurality of variable timing delaying sections, respectively, the timing clock and shift clock phase comparing section includes a plurality of timing comparing sections for comparing the phase of the shift clock generated by the shift clock generating section with phases of the plurality of timing clocks generated by the plurality of variable timing delaying sections, respectively, a delay amount adjustment step is further included for adjusting delay amounts in the plurality of variable skew delaying sections to make the phases of the plurality of timing clocks generated by the plurality of variable timing delaying sections approximately equal to each other in the plurality of timing comparing sections, respectively, the shift clock calibration step includes calibration of the shift amount of the edge of the shift clock by using a period of one of the plurality of timing clocks as a reference, and the timing clock calibration step includes calibration of delay amounts required for delaying the plurality of timing clocks by time corresponding to the predetermined shift amount by using the phases of the plurality of timing clocks adjusted in the delay amount adjustment step as a reference, respectively.

6. The timing clock calibration method of claim 1, wherein the timing clock generating section includes a variable timing delaying section for delaying a reference clock to generate the timing clock, and a variable skew delaying section for delaying the timing clock to adjust a skew of the timing clock generated by the variable timing delaying section, the timing clock and shift clock phase comparing section includes a timing comparing section for comparing the phase of the shift clock generated by the shift clock generating section and the phase of the timing clock generated by the variable timing delaying section, a delay amount adjustment step is further included for adjusting a delay amount in the variable skew delaying section to adjust the phase of the timing clock generated by the variable timing clock delaying section in the timing comparing section, the shift clock calibration step includes calibration of the shift amount of the edge of the shift clock by using a period of the timing clock as a reference, and the timing clock calibration step includes calibration of a delay amount required for delaying the timing clock by time corresponding to the predetermined shift amount by using the phase of the timing clock adjusted in the delay amount adjustment step as a reference.

7. A timing clock calibration method for use in a test apparatus including: a plurality of variable timing delaying sections for generating a plurality of timing clocks each indicating a timing at which a test signal is to be fed to a device under test; a plurality of variable skew delaying sections for delaying the plurality of timing clocks to adjust skews of the plurality of timing clocks generated by the plurality of variable timing delaying sections, respectively; a shift clock generating section for generating a shift clock used for calibration of the plurality of variable timing delaying sections by using a phase synchronization circuit; and a plurality of timing comparing sections for comparing a phase of the shift clock generated by the shift clock generating section with phases of the plurality of timing clocks generated by the plurality of variable timing delaying sections, respectively, for calibrating the plurality of variable timing delaying sections comprising:

a delay amount adjustment step for adjusting delay amounts in the plurality of variable skew delaying sections to make the phases of the plurality of timing clocks generated by the plurality of variable timing delaying sections approximately equal to each other in the plurality of timing comparing sections, respectively;

a shift clock shifting step in which the shift clock generating section shifts and generates an edge of the shift clock by a predetermined shift amount; and a timing clock calibration step for, while changing the delay amounts of the plurality of timing clocks, detecting the edge of the shift clock shifted by the predetermined shift amount in the shift clock shifting step by using the respective timing clocks to calibrate required delay amounts for delaying the plurality of timing clocks by time corresponding to the predetermined shift amount by using the phases of the plurality of timing clocks adjusted in the delay amount adjustment step as a reference.

* * * * *